United States Patent [19]

Kaganowicz et al.

[11] Patent Number: 4,572,841
[45] Date of Patent: Feb. 25, 1986

[54] LOW TEMPERATURE METHOD OF DEPOSITION SILICON DIOXIDE

[75] Inventors: Grzegorz Kaganowicz, Belle Mead, N.J.; John W. Robinson, Levittown, Pa.

[73] Assignee: RCA Corporation, Princeton, N.J.

[21] Appl. No.: 687,365

[22] Filed: Dec. 28, 1984

[51] Int. Cl.$^4$ ............................................. B05D 3/06
[52] U.S. Cl. ..................................................... 427/39
[58] Field of Search ........................................... 427/39

[56] References Cited

U.S. PATENT DOCUMENTS 4,361,595 11/1982 Kaganowicz et al. .

OTHER PUBLICATIONS

James A. Amick, et al., "Deposition Techniques for Dielectric Films on Semiconductor Devices", J. Vac. Sci. Technol., vol. 14, No. 5, Sep./Oct. 1977, pp. 1053–1063.

J. L. Miles, et al., "The Formation of Metal Oxide Films Using Gaseous and Solid Electrolytes", Journal of the Electrochemical Society, Dec. 1963, pp. 1240–1245.

Primary Examiner—Bernard D. Pianalto
Attorney, Agent, or Firm—Birgit E. Morris; Theodore R. Furman

[57] ABSTRACT

It has been found that by subjecting a source of silicon and an oxygen containing gaseous precursor to a glow discharge in the presence of an excess of hydrogen, a silicon dioxide film of substantially increased density can be deposited onto a substrate. Alternatively, where it is important to have an enhanced silicon to silicon dioxide interface, the process may comprise a first step of growing a silicon dioxide film between 50 and 1000Å thick by low temperature plasma oxidation and a second step of depositing by glow discharge an additional thickness of silicon dioxide layer, which is produced from a plasma of a source of silicon and an oxygen-containing gaseous precursor, in an excess of hydrogen.

9 Claims, 1 Drawing Figure

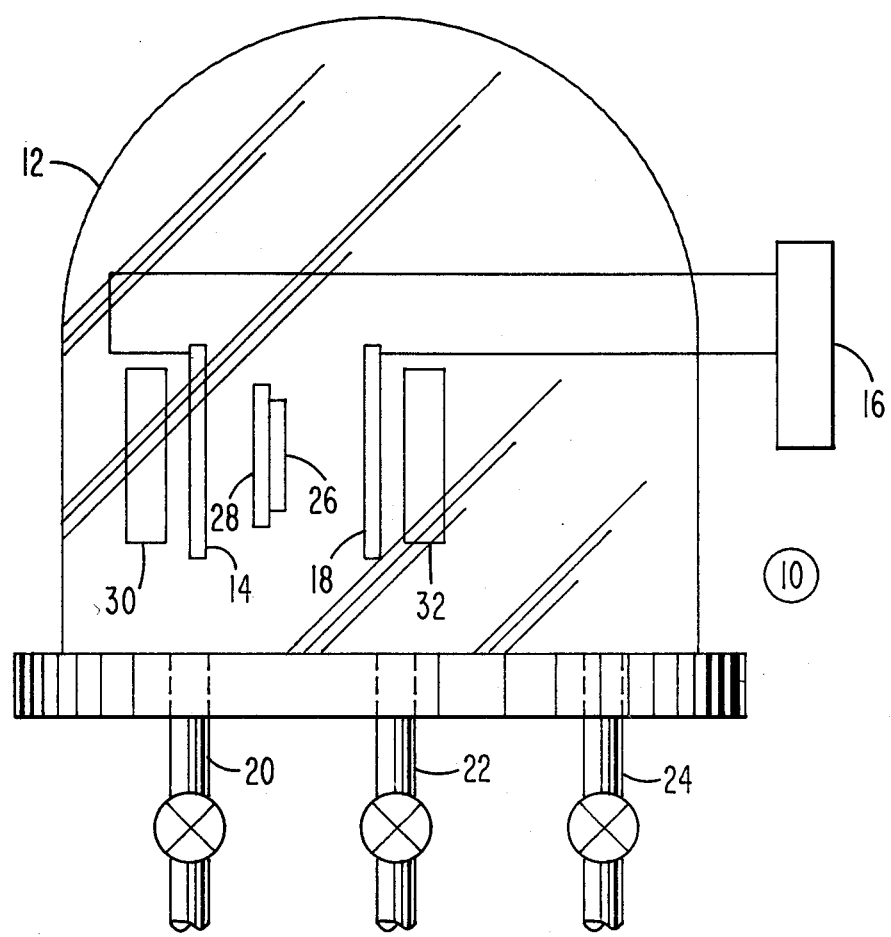

4,572,841

LOW TEMPERATURE METHOD OF DEPOSITION SILICON DIOXIDE

The present invention relates to an improved method for depositing thin films and more particularly is concerned with the deposition of temperatures below 300° C. of silicon dioxide with increased density.

BACKGROUND OF THE INVENTION

Thin silicon dioxide films have a wide range of applications in the semiconductor industry. These films are conventionally formed by several methods including thermal oxidation of silicon, plasma enhanced chemical vapor deposition (glow discharge), plasma anodization and plasma oxidation. While the films formed by oxidation are often of the highest quality, this process is carried out at about 1100°–1200° C., too high for many applications.

A copending application entitled "Low Temperature Growth of Silicon Dioxide on Silicon" filed concurrently herewith by Kaganowicz et al. describes a process for the plasma oxidation of silicon at low temperatures, i.e. below about 300° C. and preferably at about 130° C. This process produces a film of silicon dioxide of good density which is characterized by an excellent silicon to silicon dioxide interface with the underlying silicon substrate. This process, however, is diffusion limited and can efficiently produce a film of silicon dioxide only up to about 100 angstroms (Å) in thickness. To grow layers in excess of 1000 Å in thickness, it would be necessary to substantially increase the power. As this would also increase the temperature, the process could not be carried out at temperatures below about 300° C. and a principal advantage would be lost.

Plasma enhanced chemical vapor deposition, also known as glow discharge, of silane ($SiH_4$) and an oxygen containing gas is a known process of depositing a silicon dioxide layer at low temperatures. Those of ordinary skill in the art are aware that films produced by this process have poor density and, therefore, do not meet the requirements for a dielectric material in most semiconductor applications. Efforts to improve the density of films produced by this process have principally involved increasing the temperature and/or the power. Although effective to a degree, these measures disadvantageously drive the temperature above the 300° C. mark. It would be desirable, therefore, to have a process of producing silicon dioxide films at temperatures below 300° C. with good density and a good silicon to silicon dioxide interface at thicknesses greater than 1000 Å.

SUMMARY OF THE INVENTION

It has been found that by subjecting a source of silicon and an oxygen containing gaseous precursor to a glow discharge in the presence of an excess of hydrogen, a silicon dioxide film of substantially increased density can be deposited onto a substrate. Alternatively, where it is important to have an enhanced silicon to silicon dioxide interface, the process may comprise a first step of growing a silicon dioxide film between b 50 and 1000 Å thick by low temperature plasma oxidation and a second step of depositing by glow discharge an additional thickness of silicon dioxide, which is produced from a plasma of a source of silicon and an oxygen-containing gaseous precursor, in an excess of hydrogen.

DESCRIPTION OF THE DRAWING

FIG. 1 illustrates an apparatus suitable for carrying out the present invention.

DETAILED DESCRIPTION OF THE INVENTION

The deposition of a film of silicon dioxide on a suitable substrate by the glow discharge of an atmosphere comprising an oxygen-containing gaseous precursor and a source of silicon is well known to those skilled in the art. The substrate upon which such films are deposited can be silicon in any conventional form, e.g. amorphous, polycrystalline and the like, or, another semiconductor material such as $SiO_2$.

The oxygen-containing gaseous precursor may suitably be oxygen, carbon dioxide, nitrous oxide, or the like, with oxygen being preferred. A preferred source of silicon is silane.

In accordance with this invention, the density of a film of silicon dioxide produced by the glow discharge of an atmosphere comprising an oxygen-containing gaseous precursor and a source of silicon is markedly improved by carrying out the glow discharge in the presence of an excess of hydrogen. That the density of $SiO_2$ films produced by glow discharge, heretofore considered unacceptable for many semiconductor applications, could be dramatically improved by the subject process is unexpected since hydrogen is a recognized byproduct of the conventional glow discharge of silane and an oxygen-containing gas.

The excess of hydrogen is defined as an amount to be added to the silicon-containing and oxygen-containing precursors. It is an amount at least equal to that produced by a glow discharge of silane and oxygen which means that four atoms of hydrogen are added for every atom of silicon in the silicon precursor. It should be understood that this excess amount of hydrogen is independent of any hydrogen introduced as a part of the silicon-containing precursor. The upper limit of the amount of hydrogen which can be added to the atmosphere of the glow discharge is governed by the pumping capacity of the evacuating means.

The process of this invention can be used in place of the low temperature plasma oxidation method described in the copending application of Kaganowicz et al. for applications where film thicknesses above 1000 Å are desired. Alternatively, the subject process can be used in conjunction with the Kaganowicz et al. plasma oxidation process.

The improved two-step deposition of silicon dioxide over silicon in accordance with this invention is carried out by initially placing the silicon substrate in a plasma oxidation apparatus and oxidizing it according to the process described in the copending Kaganowicz et al. application. The Kaganowicz et al. plasma oxidation method comprises a low temperature, high power method which utilizes magnetron electrodes. A plasma of oxygen is initiated by applying an effective power density of between 1 and 15 Watts/$cm^2$, and preferably 6 Watts/$cm^2$, to an oxygen containing gaseous precursor such as oxygen, carbon dioxide, nitrous oxide and the like. The substrate temperature is maintained below about 300° C. and preferably at about 130° C. by conventional heatsinking means. The Kaganowicz et al. method is utilized to grow between 50 and 1000 Å of silicon dioxide and the resulting film has good density and an excellent silicon to silicon dioxide interface. This step is followed by the glow discharge deposition with excess hydrogen as described herein so that the thickness of the film can be increased as desired without sacrificing density or quality. This combined process provides a low temperature deposition of a film having a thickness in excess of 1000 Å characterized by excellent density and an enhanced silicon to silicon dioxide interface.

A preferred combined deposition process in accordance with this invention comprises growing 50 to 100 Å of silicon dioxide by the low temperature plasma oxidation process and depositing the balance of the desired film thickness by glow discharge in excess hydrogen. In this way the benefits of the good silicon/silicon dioxide interface from the Kaganowicz et al. oxidation process are combined with the good density and higher deposition rates of the glow discharge process described herein. The present method is also advantageous in that it provides deposition rates on the order of 150-300 Å/minute as opposed to the 10 to 15 Å/minute growth rate of the Kaganowicz et al. oxidation method. Therefore, whether the present method is used as a substitute for, or in conjunction with, the referred to plasma oxidation method, the deposition rates are greatly enhanced.

The glow discharge apparatus suitable for preparing the silicon dioxide material shown in FIG. 1. The apparatus 10 includes a vacuum chamber 12 which can be a glass bell jar. In the vacuum chamber 12 are two electrodes 14 and 18 which can be screen, coil or plate of a material that is a good electrical conductor and does not readily sputter. The electrodes 14 and 18 are connected to a power supply 16, which may be DC or AC or RF to produce a voltage potential. Behind the electrodes 14 and 18 are magnets 30 and 32. These magnets, 30 and 32, are typically electrically insulated from the electrodes 14 and 18. An outlet 20 from the vacuum chamber 12 allows for evacuation of the system and is connected to a pumping station not shown. The first inlet 22 and the second inlet 24 are connected to gas bleed systems, not shown, for adding the appropriate gaseous precursors.

To carry out the present method, the substrate to be coated is placed in the vacuum chamber 12 between electrodes 14 and 18. The vacuum chamber 12 is then evacuated through outlet 20 to a pressure of about 0.5 to $1.0 \times 10^{-6}$ Torr. A source of silicon such as silane (SiH$_4$), an oxygen-containing gaseous precursor such as oxygen, nitrous oxide, carbon dioxide, or the like, and hydrogen gas are introduced into the chamber 12 through inlets 22 and 24 to a pressure of about 45 microns. Plasma is then initiated by applying about 300 watts of RF power from the power supply, not shown, to electrodes 14 and 18. The plasma is maintained until a desired thickness of silicon dioxide has been deposited onto the substrate. Examination of silicon dioxide films formed by the subject process by transmission electron microscopy at magnifications up to 136,000x has revealed substantially no voids. In contrast, silicon dioxide films formed by conventional glow discharge processes have been found to have 30 to 40 percent voids or defects.

To carry out the subject process in conjunction with the Kaganowicz et al. plasma oxidation process, the substrate is loaded into the vacuum chamber 12 between electrodes 14 and 18. The vacuum chamber is evacuated through outlet 20 to a pressure of about 0.5 to $1.0 \times 10^{-6}$ Torr. An oxygen containing gaseous precursor is introduced into the chamber 12 through inlet 22 to a pressure of about 50 microns. A plasma is initiated by applying an effective power density of about 1 to 15 Watts/cm$^2$ of RF power through electrodes 14 and 18. The potential between electrodes 14 and 18 is generally about 1000 volts. The magnets 30 and 32 help concentrate the plasma in the electrode area providing relatively high power density. About 50 to 1000 Å of silicon dioxide is allowed to grow onto the silicon substrate. This generally occurs at the rate of about 10-15 Å/minute.

When a thin film, i.e. about 50 to 100 Å, is to be initially deposited, the effective power density used can be lower than the preferred 6 Watts/cm$^2$ of the copending Kaganowicz et al. application, for example, about 1 to 3 Watts/cm$^2$. When the desired initial thickness of silicon dioxide has been formed, the glow is stopped by shutting off the power and the gas supply. A source of silicon, the oxygen containing gaseous precursor and the hydrogen are then introduced into the chamber 12 through inlets 22 and 24 and the glow is initiated as above to deposit an additional thickness of silicon dioxide. A suitable gas mixture comprises about 30 sccm of silane, about 170 sccm of nitrous oxide and about 100 sccm of hydrogen. In all instances, the temperature is maintained below about 300° C. and preferably at about 130° C. Since the glow discharge deposition process utilizing excess hydrogen is not diffusion limited, the second deposition of silicon dioxide deposited over the first grown layer of silicon dioxide can be extended to any desired thickness.

Further, it should be noted that greater latitude in film thickness can be gained by utilizing the present glow discharge process in conjunction with other diffusion-limited oxidation processes, such as thermal oxidation.

The following example illustrates how the present invention is carried out. It should be noted that this process can be used individually as a deposition process or immediately after a plasma oxidation process.

EXAMPLE I

A substrate was placed in a vacuum system equipped with a planar magnetron electrode. The system was evacuated to $10^{-6}$ Torr and nitrous oxide was introduced into the system at a flow of about 170 sccm. Then silane was introduced into the system at a flow of about 29 sccm. This was followed by the introduction of hydrogen gas at a flow of about 100 sccm. The pressure at all times was maintained at 45 microns.

Three hundred watts of 13.56 MgHz RF power was supplied to the electrode and maintained for about 200 seconds. The thickness of the resulting silicon dioxide coating was 1130 Å and its index of refraction was 1.450. A section of the coating was examined by transmission electron microscopy at high magnification (136,000x) and no voids were observed.

As a control, a silicon dioxide layer was deposited in exactly the same manner as described above with the exception that no hydrogen was introduced into the glow discharge. A section of the coating was examined by transmission electron microscopy and found to contain approximately 30-35 percent of voids. A silicon dioxide film containing this amount of voids would not be useful as a dielectric for most semiconductor applications.

We claim:

1. In a process for depositing a dense silicon dioxide film onto a substrate in a glow discharge apparatus comprising the steps of placing the substrate into the deposition chamber of said apparatus;

evacuating said chamber;

introducing a source of silicon and an oxygen containing gaseous precursor into said chamber;

applying sufficient power to generate a plasma and thereby deposit silicon dioxide onto said substrate;

the improvement comprising introducing hydrogen into said chamber in an amount such that at least 4 atoms of hydrogen are introduced for every atom of silicon introduced by the silicon-containing precursor and further wherein said amount of hydrogen is independent of any hydrogen introduced by said silicon-containing precursor.

2. The method of claim 1 wherein the source of silicon is silane.

3. The method of claim 1 wherein the oxygen-containing gaseous precursor is selected from the group consisting essentially of oxygen, nitrous oxide and carbon dioxide.

4. A low temperature method of depositing a dense silicon dioxide film onto a silicon substrate comprising;

placing the substrate in a deposition chamber of a magnetically enhanced glow discharge apparatus;

evacuating the chamber;

introducing a gaseous oxygen-containing precursor into said chamber;

initiating a plasma by applying sufficient power from a power source through a magnetron electrode to provide an effective power density of between about 1 and 15 watts/cm$^2$, thereby growing a first thickness of silicon dioxide;

introducing a source of silicon, an oxygen containing gaseous precursor, and hydrogen into said chamber in an amount such that at least 4 atoms of hydrogen are introduced for every atom of silicon introduced by the silicon-containing precursor and further wherein said amount of hydrogen is independent of any hydrogen introduced by said silicon-containing precursor; and, initiating a plasma in said chamber to deposit a second desired thickness of silicon dioxide, wherein the temperature is maintained to be below about 300° C. during both depositions.

5. The method of claim 4 wherein the source of silicon is silane.

6. The method of claim 4 wherein the oxygen-containing gaseous precursor is selected from the group consisting essentially of oxygen, nitrous oxide and carbon dioxide.

7. The method of claim 4 wherein said first thickness of silicon dioxide is between about 50 and 1000 angstroms.

8. The method of claim 4 wherein said first thickness of silicon dioxide is between about 50 and 100 angstroms.

9. The method of claim 8 wherein the oxidation step is carried out using an effective power density of about 1 to 3 Watts/cm$^2$.

* * * * *

UNITED STATES PATENT AND TRADEMARK OFFICE
CERTIFICATE OF CORRECTION

PATENT NO. : 4,572,841

DATED : February 25, 1986

INVENTOR(S) : Grzegorz Kaganowicz et al.

It is certified that error appears in the above-identified patent and that said Letters Patent is hereby corrected as shown below:

The title should be --Low Temperature Method of Depositing Silicon Dioxide with Increased Density--.

Column 1, line 30, "100" should be --1000--.

Column 1, line 62, "b" should be deleted.

Signed and Sealed this

Third Day of June 1986

[SEAL]

Attest:

DONALD J. QUIGG

Attesting Officer

Commissioner of Patents and Trademarks